(12) United States Patent
Tsai et al.

(10) Patent No.: US 9,721,853 B2
(45) Date of Patent: Aug. 1, 2017

(54) SYSTEM AND METHOD FOR FORMING A SEMICONDUCTOR DEVICE

(71) Applicant: Taiwan Semiconductor Manufacturing Company, Ltd., Hsin-Chu (TW)

(72) Inventors: Chun Hsiung Tsai, Xinpu Township (TW); Ming-Te Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 46 days.

(21) Appl. No.: 13/892,421

(22) Filed: May 13, 2013

(65) Prior Publication Data
US 2014/0273294 A1 Sep. 18, 2014

Related U.S. Application Data

(60) Provisional application No. 61/778,747, filed on Mar. 13, 2013.

(51) Int. Cl.
*G01N 3/00* (2006.01)
*G01K 7/01* (2006.01)
(Continued)

(52) U.S. Cl.
CPC ............ *H01L 22/12* (2013.01); *H01L 21/324* (2013.01); *H01L 21/67288* (2013.01); *H01L 22/20* (2013.01); *H01L 22/26* (2013.01)

(58) Field of Classification Search
CPC .............. H01L 21/324; H01L 21/0228; H01L 21/76864; H01L 29/7869; H01L 45/1616;
(Continued)

(56) References Cited

U.S. PATENT DOCUMENTS 5,506,672 A * 4/1996 Moslehi ..................... 356/514
5,677,090 A * 10/1997 Marumoto et al. ......... 430/5
(Continued)

FOREIGN PATENT DOCUMENTS

DE 102005054552 A * 5/2007
JP 2007109704 A * 4/2007

OTHER PUBLICATIONS

NN9512235: "Use of the Reflectivity Measurement in Infrared to Assess Stress in N-58 Ceramic Wafers". IBM Technical Disclosure Bulletin, IBM Corporation, Dec. 1995, USA.*
(Continued)

*Primary Examiner* — Gail Kaplan Verbitsky
(74) *Attorney, Agent, or Firm* — Slater Matsil, LLP

(57) ABSTRACT

A system and method for forming a semiconductor device is provided. The system may measure characteristics of the substrate to determine an amount of induced stress on the substrate. The measured characteristics may include warpage, reflectivity and/or crack information about the substrate. The induced stress may be determined, at least in part, based on the measured characteristics. The system may compare the induced stress on the substrate to a maximum intrinsic strength of the substrate and adjust an anneal for the substrate based on the comparison. The adjustment may reduce or limit breakage of the substrate during the anneal. The system may control at least one of a peak anneal temperature and a maximum anneal duration for an anneal unit, which may perform an anneal on the substrate. The measurements and control may be performed ex-situ or in-situ with the anneal.

10 Claims, 6 Drawing Sheets

(51) Int. Cl.
*H01L 21/66* (2006.01)
*H01L 21/67* (2006.01)
*H01L 21/324* (2006.01)

(58) Field of Classification Search
CPC ... H01L 21/67248; H01L 27/04; C23C 16/54; G01K 7/01; G01N 3/00
See application file for complete search history.

(56) References Cited

U.S. PATENT DOCUMENTS

| | | | | |
|---|---|---|---|---|
| 5,944,964 | A * | 8/1999 | Solberg et al. | 204/192.26 |
| 6,184,498 | B1 * | 2/2001 | Kiyama | 219/390 |
| 6,235,543 | B1 * | 5/2001 | Kiyama | 438/5 |
| 6,710,320 | B2 * | 3/2004 | Kurata | G01D 5/342 |
| | | | | 250/208.1 |
| 6,731,391 | B1 * | 5/2004 | Kao | G01B 11/254 |
| | | | | 250/237 G |
| 6,748,350 | B2 * | 6/2004 | Rumer | H01L 23/34 |
| | | | | 257/706 |
| 7,037,733 | B2 * | 5/2006 | Shibata et al. | 438/11 |
| 7,080,561 | B2 * | 7/2006 | Bohlmann | G01N 3/08 |
| | | | | 73/800 |
| 7,083,327 | B1 * | 8/2006 | Shepard | G01N 25/72 |
| | | | | 374/124 |
| 7,744,274 | B1 * | 6/2010 | Grek et al. | 374/124 |
| 7,763,553 | B2 * | 7/2010 | Ito et al. | 438/795 |
| 8,215,829 | B2 * | 7/2012 | Kono | G01N 3/00 |
| | | | | 374/43 |
| 8,356,936 | B2 * | 1/2013 | Jabado et al. | 374/162 |
| 8,471,585 | B2 * | 6/2013 | Miyazono | H01L 22/14 |
| | | | | 324/762.01 |
| 8,474,286 | B2 * | 7/2013 | Pitbladdo | 65/129 |
| 8,661,671 | B2 * | 3/2014 | Hill, Jr. | C04B 35/478 |
| | | | | 29/890 |
| 8,720,225 | B2 * | 5/2014 | Pitbladdo | 65/29.14 |
| 2002/0114999 | A1 * | 8/2002 | Brooks et al. | 430/5 |
| 2005/0026447 | A1 * | 2/2005 | Shajii et al. | 438/715 |
| 2007/0299628 | A1 * | 12/2007 | Sun | G01B 21/085 |
| | | | | 702/170 |
| 2008/0160338 | A1 * | 7/2008 | Tanibuchi et al. | 428/627 |
| 2008/0248599 | A1 * | 10/2008 | Jaiswal et al. | 438/10 |
| 2009/0084959 | A1 * | 4/2009 | Hudgings | G01J 5/0003 |
| | | | | 250/341.8 |
| 2009/0159840 | A1 * | 6/2009 | Oda | B01D 53/228 |
| | | | | 252/182.11 |
| 2009/0296774 | A1 * | 12/2009 | Koelmel et al. | 374/121 |
| 2010/0019330 | A1 * | 1/2010 | Cannon et al. | 257/402 |
| 2010/0136715 | A1 * | 6/2010 | Sopori | H01L 31/18 |
| | | | | 438/14 |
| 2010/0240227 | A1 * | 9/2010 | Gluschenkov et al. | 438/799 |
| 2010/0271633 | A1 * | 10/2010 | Gomi | G01N 21/6489 |
| | | | | 356/448 |
| 2011/0244604 | A1 * | 10/2011 | Narazaki et al. | 438/17 |
| 2012/0208377 | A1 * | 8/2012 | Timans | 438/799 |
| 2013/0028286 | A1 * | 1/2013 | Timans | 374/1 |
| 2013/0320578 | A1 * | 12/2013 | Blackshear | H01L 21/4803 |
| | | | | 264/40.1 |
| 2014/0085449 | A1 * | 3/2014 | Mandelis | A61B 5/0073 |
| | | | | 348/77 |
| 2014/0158674 | A1 * | 6/2014 | Moffatt et al. | 219/385 |
| 2014/0269830 | A1 * | 9/2014 | Wardle et al. | 374/152 |

OTHER PUBLICATIONS http://www.marketwire.com/mw/emailprcntct?id=C11FAA9049736871, "Zygo Corporation Receives First Order for Z3D-7200™ Multifunctional Wafer Metrology and Inspection Tool," Oct. 16, 2006, 1 page,Zygo Corporation, Middlefield, CT.

* cited by examiner

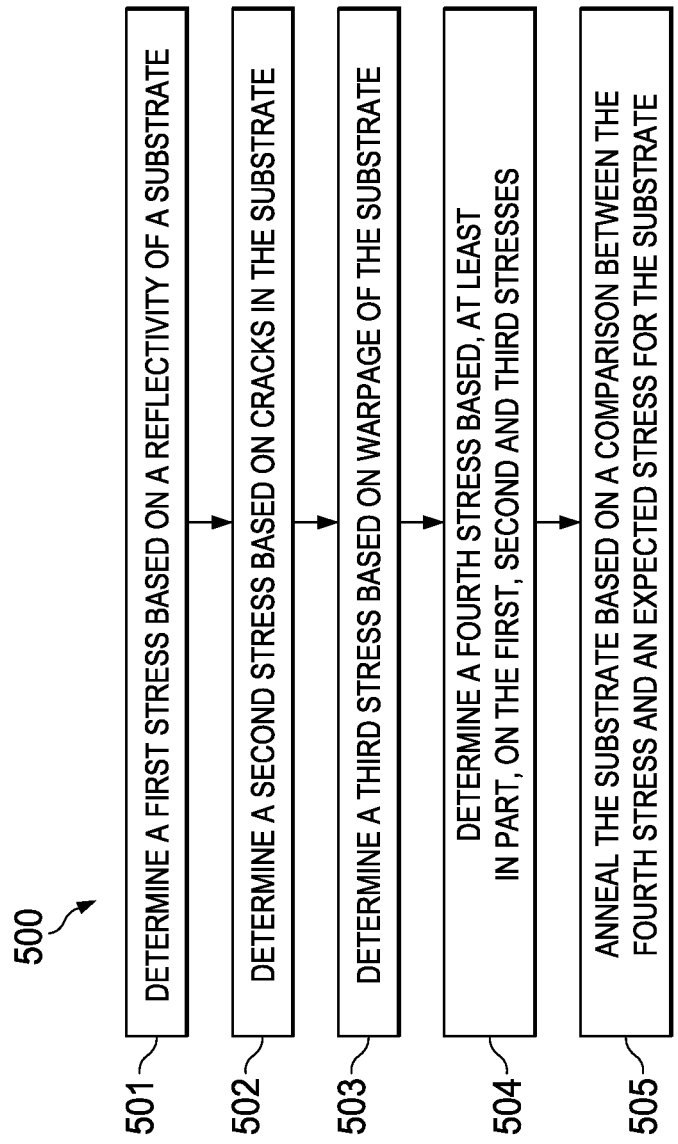

SYSTEM AND METHOD FOR FORMING A SEMICONDUCTOR DEVICE

CROSS REFERENCE TO RELATED APPLICATIONS

This application claims the benefit of priority to U.S. Provisional Application Ser. No. 61/778,747, filed on Mar. 13, 2013, entitled "System and Method to Reduce Substrate Breakage," which application is hereby incorporated by reference herein.

BACKGROUND

In a semiconductor manufacturing process, integrated circuits (also referred to as "dies") are fabricated in a die area on a semiconductor wafer. The semiconductor wafer goes through many processing steps before the dies are separated by cutting the semiconductor wafer. The processing steps can include lithography, etching, doping, annealing, grinding, blade cutting, die-sawing and/or depositing different materials. The processing steps can include wet and dry processing steps. Semiconductor wafers and/or separated dies can be stacked or bonded on top of each other to form a three-dimensional ("3D") IC. For example, a semiconductor wafer, which may or may not include electrical devices, can be bonded to another semiconductor wafer having micro electrical-mechanical system ("MEMS") devices formed therein. After bonding, the wafers are cut or separated into bonded dies, which may consist of devices from both wafers.

BRIEF DESCRIPTION OF THE DRAWINGS

For a more complete understanding of the present embodiments, and the advantages thereof, reference is now made to the following descriptions taken in conjunction with the accompanying drawings, in which:

FIG. 5 illustrates another method for annealing a substrate according to an embodiment.

DETAILED DESCRIPTION

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments. Throughout the various views and illustrative embodiments, like reference numbers are used to designate like elements.

During semiconductor manufacturing processing, a millisecond anneal ("MSA") may be performed on a substrate. An MSA may be used, for example, to activate doping for a substrate and/or to promote epitaxial growth for a substrate. An example of an MSA process may include, for example, placing a wafer in an annealing apparatus which may be pre-heated to a pre-heat temperature and performing a rapid ramping from the pre-heat temperature to a peak temperature. The MSA may be performed for a duration of time. The combined rapid ramping as well as the duration of an MSA may cause thermal shock to a substrate in a manner that may stress the substrate past its maximum intrinsic strength and cause the substrate to break. The maximum intrinsic strength of substrates may vary, but may generally be approximated to 180 MPa.

Prior to annealing substrate using an MSA, the substrate may undergo various pre-processing steps that may include, but not be limited to, the formation thereon of one or more layers of dielectric, insulating, or metallization materials; doping the substrate with impurities; and/or forming electrical circuits or devices within or on the substrate. The pre-processing may be referred to herein as a substrate "recipe." The recipe may induce stresses on the substrate. The stresses may manifest through changes in various characteristics of the substrate, which may include but not be limited to, substrate distortion or warpage, which may be caused by thermal processes performed on the wafer; substrate cracks or microcracks, which may be caused by handling or movement of the substrate through various processes; and varied reflectivity, which may increase or decrease based on the layers and/or devices that may be formed on or within the substrate.

Embodiments discussed herein may include a system to control an MSA for a substrate. The system may measure and/or monitor characteristics or monitor stresses for a substrate. The system may compare the measured or monitored characteristics or stresses to expected characteristics or stress associated with a recipe for the substrate or may compare the measured or monitored stresses to a maximum intrinsic strength for the substrate. The system may adjust a peak temperature and/or the duration of the MSA in order to maintain stresses for the substrate within an acceptable range, which may reduce substrate breakage for an MSA process.

Figure 1:
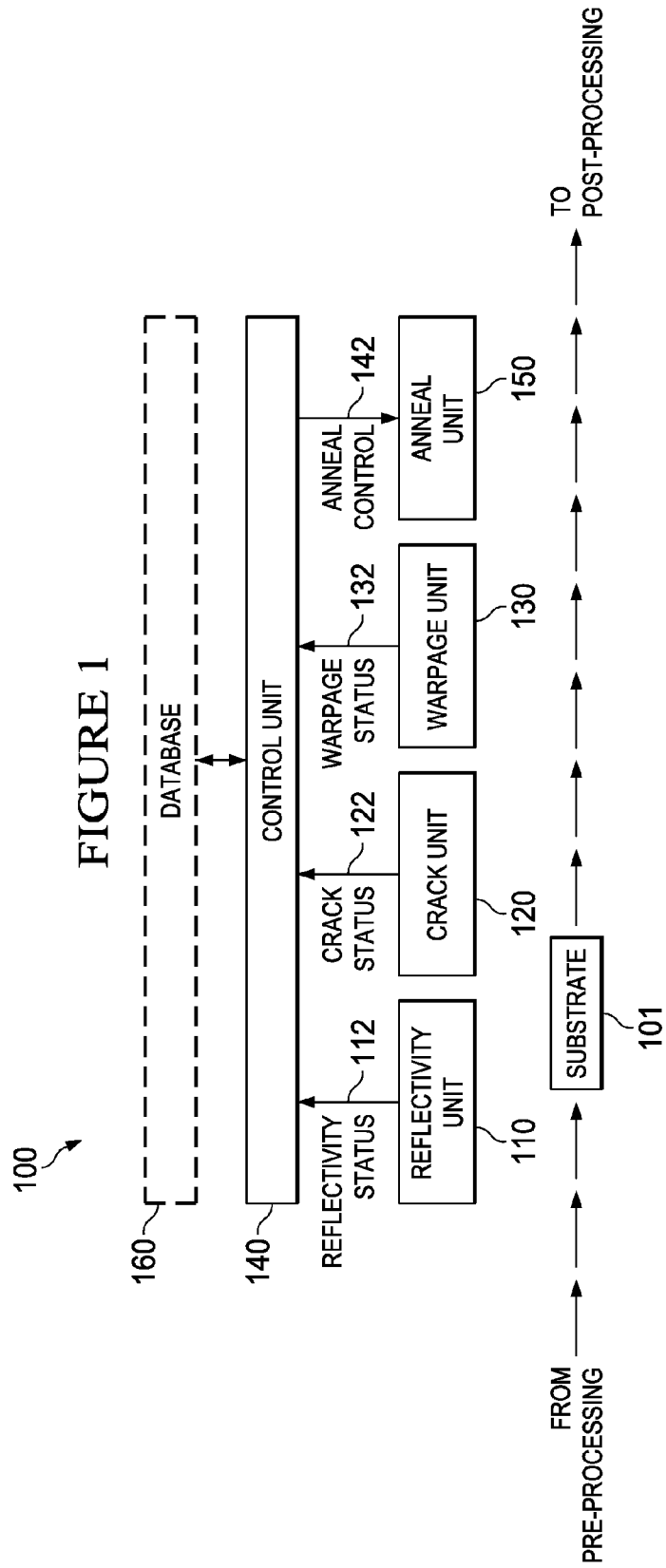
FIG. 1 illustrates a system to control an anneal for a substrate according to an embodiment.

FIG. 1 illustrates a system 100 to control an anneal for a substrate according to an embodiment. As illustrated in FIG. 1, the system 100 may operate on a substrate 101 to measure a plurality of characteristics of the substrate 101. The system may include a reflectivity unit 110 to measure reflectivity of the substrate 101, a crack unit 120 to measure one or more microcracks that may be present on the substrate 101, a warpage unit 130 to measure warpage of the substrate 101 and a control unit 140 to provide an anneal control signal 142 to an anneal unit 150, which may perform an MSA on the substrate 101. Although only a single substrate 101 is illustrated in FIG. 1, it should be understood that the system 100 may operate on a plurality of substrates within a manufacturing system.

As illustrated by flow arrows in FIG. 1, the system 100 may operate on the substrate 101 after various pre-processing steps have been performed on the substrate 101. For example, the substrate 101 may have formed thereon or therein dielectric layers, metallization layers, electrical devices, molding compounds, etc. based on a processing recipe for the substrate 101. In various embodiments, the substrate 101 may be a wafer, die, interposer or the like. In an embodiment, the substrate 101 may comprise bulk silicon. In other embodiments, the substrate 101 may comprise any semiconductor substrate, ceramic substrate, quartz substrate or the like. In some embodiments, the substrate 101 may comprise a silicon-on-insulator ("SOT") or other like substrate. Other substrates that may be used include multi-layered substrates, gradient substrates, or hybrid orientation substrates.

The reflectivity unit 110 may operate on the substrate 101 by performing one or more reflection measurements on the substrate 101 and may output a reflectivity status signal 112 based on the one or more measurements of the substrate 101. The crack unit 120 may operate on the substrate 101 by performing one or more microcrack measurements (a microcrack may be referred to herein generally as a crack) on the substrate 101 and may output a crack status signal 122 based on the one or more crack measurements of the substrate 101. The warpage unit 130 may perform one or more warpage measurements on the substrate 101 and may output a warpage status signal 132 based on the one or more warpage measurements. The control unit 140 may receive each of the reflectivity status signal 112, the crack status signal 122, and the warpage status signal 132; the control unit may generate the anneal control signal 142 based, at least in part, on the received signals. Operation of the reflectivity unit 110, the crack unit 120, the warpage unit 130 and the control unit 140 are discussed in more detail below.

Figure 1A:
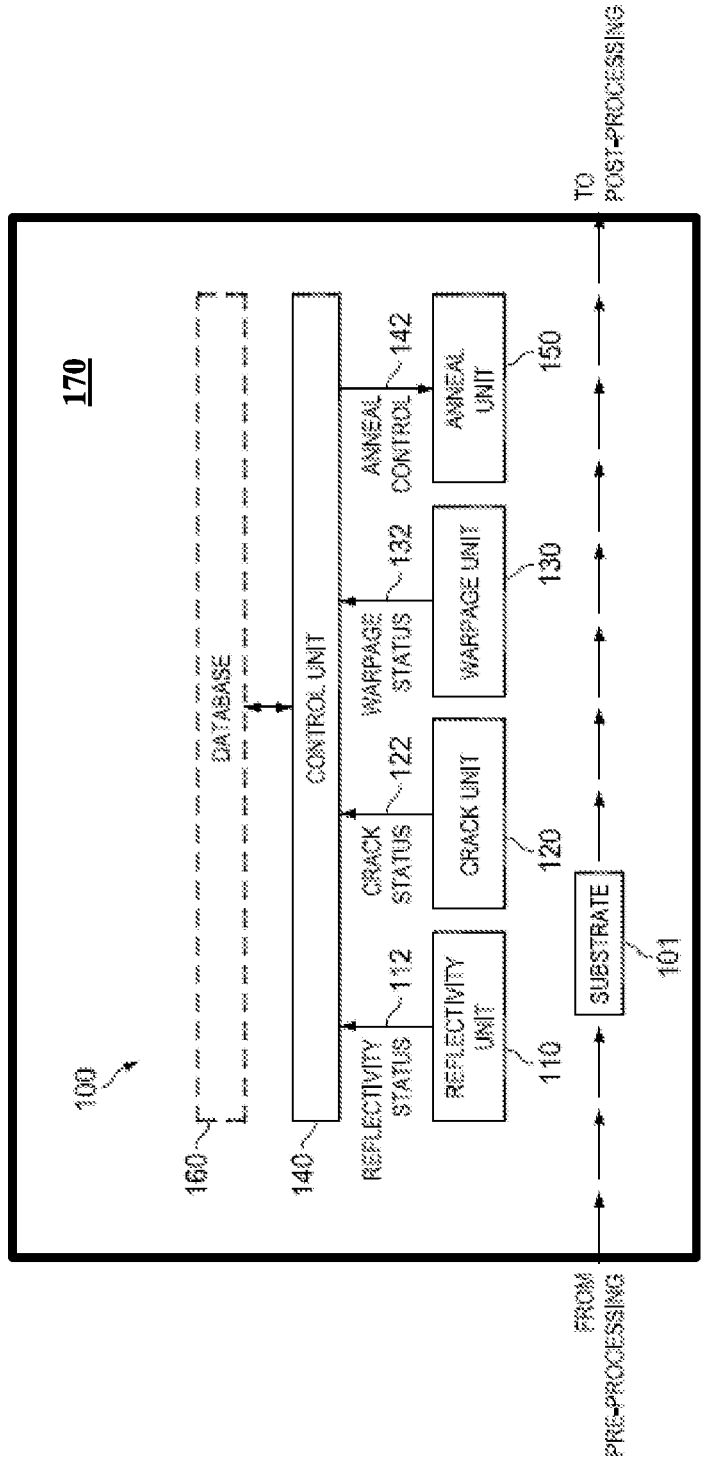
FIGS. 1A and 1B illustrate various configurations of the components of the system of FIG. 1.
Figure 1B:
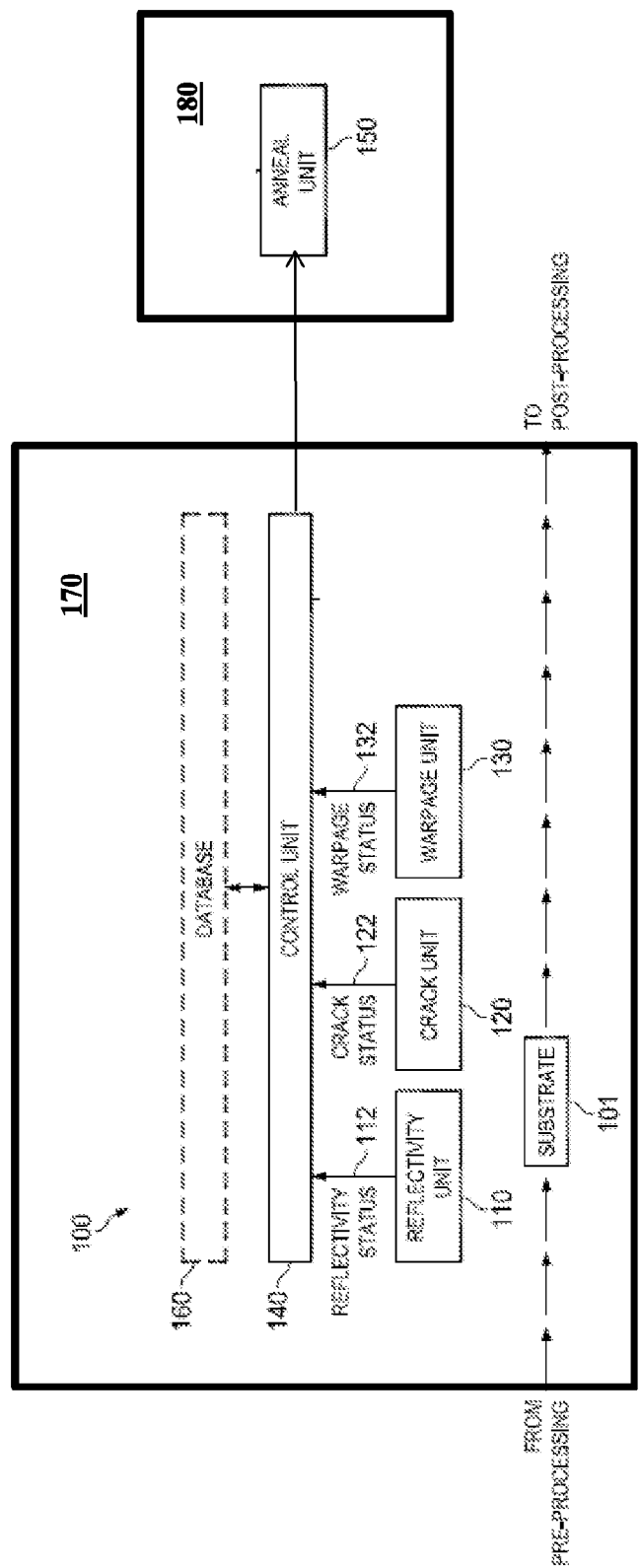

The anneal unit 150 may be in a processing chamber (not shown) common to or separated from at least one of the reflectivity unit 110, the crack unit 120, the warpage unit 130 and/or the control unit 140. FIG. 1A illustrates the anneal unit 150 in a common processing chamber 170 with the reflectivity unit 110, the crack unit 120, the warpage unit 130, and the control unit 140. Alternatively, the reflectivity unit 110, the crack unit 120, the warpage unit 130 and the control unit 140 may be enclosed in the common processing chamber 170, while the anneal unit 150 may be external to the common processing chamber 170, for example, in separate processing chamber 180, as illustrated in FIG. 1B. The anneal control signal 142 may be coupled to the external anneal unit 150, which may be perform an "ex-situ" anneal on the substrate 101 following one or more operations performed by the reflectivity unit 110, the crack unit 120, and/or the warpage unit 130 on the substrate 101.

In another example, at least one of the reflectivity unit 110, the crack unit 120, the warpage unit 130, and the control unit 140 may be enclosed in the common processing chamber 170, with the anneal unit 150. The anneal control signal 142 may be coupled to the anneal unit 150, which may perform an "in-situ" anneal on the substrate 101 during or contemporaneous with one or more operations performed by at least one of the reflectivity unit 110, the crack unit 120 and/or the warpage unit 130 on the substrate 101. Other embodiments may include other configurations of the various units in common or separate processing chambers.

The control unit 140 may set a peak anneal temperature $T_{PEAK}$ and a maximum anneal duration or time $TIME_{MAX}$ for an MSA by controlling the anneal unit 150. The control unit 140 may set the peak anneal temperature $T_{PEAK}$ and maximum anneal duration $TIME_{MAX}$ for the MSA based, at least in part, on the received reflectivity status signal 112, the crack status signal 122 and or the warpage status signal 132. In various embodiments, the peak anneal temperature $T_{PEAK}$ may range from approximately 1100° C. to approximately 1200° C. In various embodiments, the maximum anneal duration $TIME_{MAX}$ may range from approximately 0.8 ms to approximately 5 ms. The control unit 140 may also halt an MSA altogether based on the various status signals.

The reflectivity unit 110 may perform one or more reflectivity measurements on the substrate 101 to measure reflectivity characteristics of the substrate. The reflectivity unit 110 may use a process that may include, for example, exposing the substrate to a light source and measuring an amount of reflected light from the substrate 101. In an embodiment, the light source may include a xenon light source, which may have a wavelength from approximately 250 nm to approximately 750 nm. In an embodiment, the reflectivity unit 110 may output a value corresponding to the reflectivity of the substrate 101 using the reflectivity status signal 112. In another embodiment, the reflectivity unit 110 may compare a measured reflectivity to an expected reflectivity value and may output a flag corresponding to the comparison (e.g., whether the measured reflectivity is less than or greater than the expected reflectivity). In another embodiment, the reflectivity unit 110 may correlate the measured reflectivity to a stress value based on the recipe for the substrate 101.

The crack unit 120 may perform one or more crack measurements on the substrate 101 to determine the presence, the number and/or the characteristics of cracks that may be present on the substrate 101. The crack unit 120 may perform the one or more crack measurements using, for example, transmission mode X-ray diffraction ("XRD") and/or digital image processing techniques. The one or more measurements may measure cracks that may be located on one or more lateral surfaces and/or on vertical surfaces of the substrate 101. The one or more measurements may also measure cracks that may be buried within the substrate 101. For example, the crack unit 120 may measure a number of cracks that may be on and/or within the substrate 101 and may output a value corresponding to the number of cracks using the crack status signal 122. In another example, the crack unit 120 may measure a location of one or more cracks on that may be on or within the substrate 101. In another example, the crack unit 120 may measure a proximity of one or more cracks to an edge of the substrate 101.

The crack unit 120 may also output values corresponding to the one or more measured crack values. The crack unit 120 may also measure one or more cracks and compare the measurements to a crack threshold; the crack unit 120 may output a flag corresponding to the comparison. The one or more crack measurements may also include a measurement of a crack radius for one or more cracks and a comparison thereof to a maximum crack radius threshold. For example, a maximum crack radius may be approximately 3 μm.

The crack unit 120 may also determine a stress value for the substrate 101 based on a measured number of cracks and/or measured crack characteristics. For example, the stress on the substrate 101 may vary between approximately 1 MPa to approximately 25 MPa based on the measured numbers of cracks and/or the characteristics of the measured cracks.

The warpage unit 130 may perform one or more warpage measurements on the substrate 101. The warpage measurements may include a measurement of an amount of bow of a wafer; the warpage unit may output a value corresponding to the bow using the warpage status signal 132. A wafer metrology tool may be used to measure the warpage. The one or more warpage measurements may include a comparison of a measured warpage to an expected warpage range for the substrate 101. For example, the expected warpage range may vary from approximately 40 μm to approximately 130 μm. The warpage unit 130 may output a flag corresponding to the comparison using the warpage status signal 132. The flag may indicate if the measured warpage of the substrate is less or greater than a maximum expected warpage. The warpage unit 130 may also correlate the measured warpage to a stress value based on the measurements. For example, the stress on the substrate 101 may vary between approximately 0 MPa to approximately 2 MPa based on the measured warpage for the substrate 101. The warpage unit 130 may output a stress value as determined by the measured warpage for the substrate 101.

As noted above, the control unit 140 may receive the reflectivity status signal 112, the crack status signal 122 and the warpage status signal 132 and may monitor the signals. Based at least in part on the monitoring and received statuses, the control unit 140 may control the anneal unit 150 by setting the peak anneal temperature $T_{PEAK}$ and/or the maximum anneal duration $TIME_{MAX}$ for an MSA. The control unit 140 may also halt an MSA altogether based on the various status signals. Embodiments of the system 100 may provide for in-situ or ex-situ control of the anneal unit.

For example, for ex-situ control of the anneal unit 150, each of the reflectivity unit 110, the crack unit 120, and/or the warpage unit 130 may operate on the substrate 101 and measure various characteristics of the substrate 101. The characteristics may include a reflectivity value for the substrate 101, a number of cracks on the substrate 101, and a warpage for the substrate 101. The values may be sent to the control unit 140, which may then control the anneal unit 150 that may be external to the reflectivity unit 110, the crack unit 120, and/or the warpage unit 130.

The control unit 140 may have stored therein information about the substrate 101, which may include processing recipe information for the substrate 101, an expected reflectivity value, an expected crack value, an expected warpage value for the substrate 101 based on the recipe and/or stress information related to various recipes or characteristic measurements.

The control unit 140 may also have information regarding an expected peak anneal temperature $T_{PEAK}$ and maximum anneal duration $TIME_{MAX}$ for an MSA based on the substrate 101 recipe The control unit 140 may adjust the peak anneal temperature $T_{PEAK}$ and/or the maximum anneal duration $TIME_{MAX}$ based, at least in part, on the status signals received by the control unit 140.

For example, as noted above, the various measurement units 110-130 may send stress values to the control unit 140 based on the measured characteristics of the substrate. The control unit 140 may use stored information to determine an expected stress on the substrate 101 based on recipe. The control unit 140 may compare the various measured stress values to the expected stress values and may adjust the peak anneal temperature $T_{PEAK}$ and/or the maximum anneal duration $TIME_{MAX}$ for an MSA using the anneal unit 150.

In another example, the control unit 140 may also have information related to maximum intrinsic strength value for the substrate 101. The control unit 140 may adjust the peak anneal temperature $T_{PEAK}$ and/or the maximum anneal duration $TIME_{MAX}$ for an MSA based on a comparison between the overall stress on the substrate 101 and the maximum intrinsic strength for the substrate 101.

In another example, the control unit 140 may have information regarding expected values for the reflectivity, cracks, and/or warpage for the substrate 101. The control unit 140 may adjust the peak anneal temperature $T_{PEAK}$ and/or the maximum anneal duration $TIME_{MAX}$ for an MSA based, at least in part, on a comparison between the measured reflectivity, cracks, and/or warpage on the substrate 101 and the expected values for the substrate 101 based on recipe.

In another example, the control unit 140 may be coupled to a database 160. The database may include stored information related to a plurality of substrate recipes including, but not limited to, expected stress for the substrate 101 based on recipe, expected ranges of reflectivity, expected number of cracks, crack radii and/or crack locations; and/or expected ranges of warpage for the substrate 101 based on recipe. The control unit may compare the stored information with the measured values to adjust the peak anneal temperature $T_{PEAK}$ and/or the maximum anneal duration $TIME_{MAX}$ for an MSA that may be performed on the substrate 101 using the anneal unit 150.

For in-situ anneal control of the anneal unit 150, the system 100 may perform similar measurements and comparisons between measured and known or expected values for the substrate 101 based on recipe, however, in contrast to the ex-situ control, the control unit 140 may adjust the peak anneal temperature $T_{PEAK}$ and/or the maximum anneal duration $MAX_{TIME}$ for an MSA based on real-time or closed-loop measurements and comparisons that may be performed during or contemporaneous with an MSA using the anneal unit 150. In such an embodiment, the reflectivity unit 110, the crack unit 120, the warpage unit 130 and/or the anneal unit 150 may be enclosed within a common processing chamber.

Figure 2:
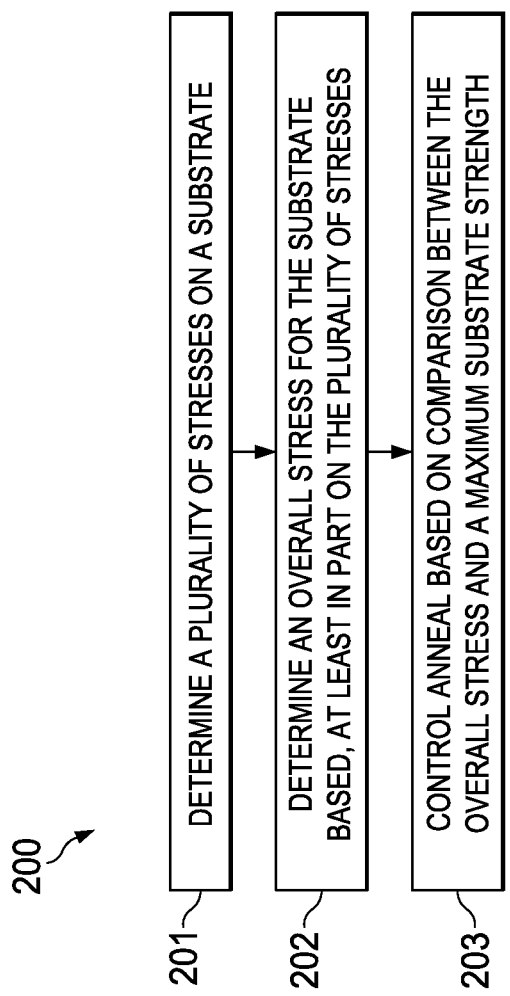
FIG. 2 illustrates a method for controlling an anneal according to an embodiment.

FIG. 2 illustrates a method 200 for controlling an anneal according to an embodiment. The method may include determining a plurality of stresses on a substrate (block 201); determining an overall stress on the substrate based, at least in part, on the plurality of stresses (block 202); and controlling an anneal for the substrate based on a comparison between the overall stress on the substrate and a strength threshold for the substrate (block 203). In an embodiment, the determining the overall stress may include, at least in part, a summation of the plurality of stresses. In an embodiment, the determining the overall stress may include, at least in part, a weighted summation of the plurality of stresses.

In an embodiment, the determining a plurality of stresses on the substrate may include measuring a number of cracks on the substrate; and determining a stress value for the substrate based on the number of cracks, wherein the stress value is included in the overall stress on the substrate. In an embodiment, the determining a plurality of stresses on the substrate may include measuring a crack radius for each of one or more cracks on the substrate; and determining a stress value for the substrate based on the measured crack radius for each of the one or more cracks, wherein the stress value is included in the overall stress on the substrate.

In an embodiment, the determining a plurality of stresses on the substrate may include measuring a location of one or more cracks on the substrate; and determining a stress value for the substrate based on the measured location of the one or more cracks, wherein the stress value is included in the overall stress on the substrate.

In an embodiment, the determining a plurality of stresses on the substrate may include measuring reflectivity of the substrate; and determining a stress value for the substrate based on the measured reflectivity of the substrate, wherein the stress value is included in the overall stress on the substrate. In an embodiment, the determining a plurality of stresses may include measuring warpage for the substrate; and determining a stress value for the substrate based on the measured warpage of the substrate, wherein the stress value is included in the overall stress on the substrate.

Figure 3:
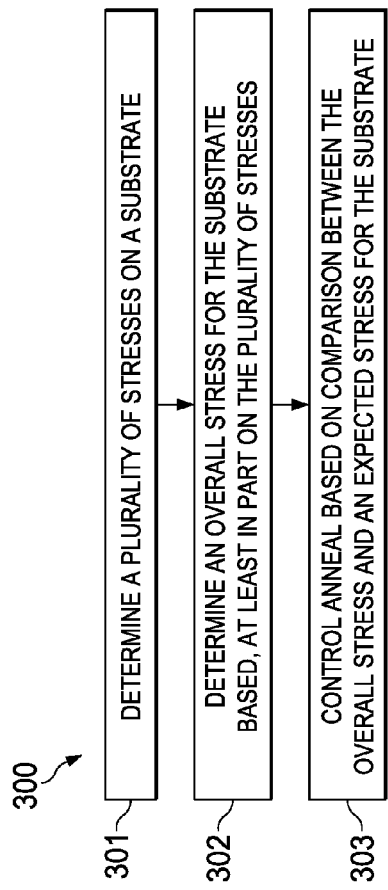
FIG. 3 illustrates a method for controlling an anneal according to another embodiment.

FIG. 3 illustrates a method 300 for controlling an anneal according to another embodiment. The method may include determining a plurality of stresses on a substrate (block 301); determining an overall stress on the substrate based, at least in part, on the plurality of stresses (block 302); and controlling an anneal for the substrate based on a comparison between the overall stress on the substrate and an expected stress for the substrate (block 303). In an embodiment, the determining the overall stress may include, at least in part, a summation of the plurality of stresses. In an embodiment, the overall stress may include, at least in part, a weighted summation of the plurality of stresses. In an embodiment, the method 300 may reduce at least one of a peak anneal temperature and a maximum anneal duration for the anneal if the overall stress is greater than or equal to the expected stress of the substrate.

Figure 4:
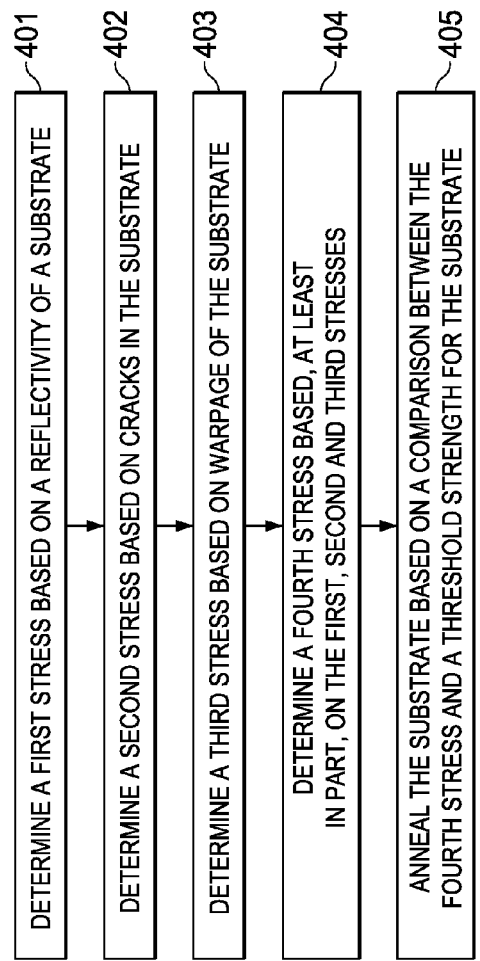
FIG. 4 illustrates a method for annealing a substrate according to an embodiment.

FIG. 4 illustrates a method 400 for annealing a substrate according to an embodiment. The method may include determining a first stress for a substrate based on a reflectivity of the substrate (bock 401); determining a second stress for the substrate based on cracks in the substrate (block 402); determining a third stress for the substrate based on a warpage of the substrate (block 403); determining a fourth stress based, at least in part, on the first stress (block 404), the second stress and the third stress; and annealing the substrate based on a comparison between the fourth stress and a threshold strength of the substrate (block 405). For example, the method 400 may reduce at least one of a peak anneal temperature and a maximum anneal duration for the annealing if the fourth stress is greater than or equal to the threshold strength of the substrate.

In an embodiment, the determining the first stress may further include determining a baseline reflectivity of the substrate, measuring the reflectivity of the substrate, comparing the measured reflectivity to the baseline reflectivity and correlating the comparison to a stress value to determine the first stress. The comparing may include determining a difference between the measured reflectivity and the baseline reflectivity.

In another embodiment, the determining the second stress may include determining a number of cracks in the substrate. The second stress may be determined, at least in part, based on the number of cracks in the substrate. In another embodiment, the determining the second stress may include determining a maximum crack radius for one or more cracks in the substrate. The second stress may be based, at least in part, on the maximum crack radius of the one or more cracks in the substrate. In another embodiment, the determining the second stress may include determining a number of cracks in a first and/or second lateral surface of the substrate. The second stress may be determined, at least in part on the number of cracks in the first and/or second lateral surface. In another embodiment, the determining the second stress may include determining a number of cracks in one or more vertical surfaces (sides) of the substrate. The second stress may be determined, at least in part, based on the number of cracks in the one or more vertical surfaces. In another embodiment, the determining the second stress may include determining a number of cracks buried in the substrate. The second stress may be determined, at least in part, based on the number of cracks buried in the substrate. In another embodiment, the determining the second stress may include determining a proximity of a crack to an edge of the substrate. The second stress may be determined, at least in part, based on the proximity of the crack to the edge of the substrate.

In another embodiment, the determining the third stress may further include determining a baseline warpage of the substrate, measuring the warpage of the substrate, comparing the measured warpage to the baseline warpage and correlating the comparison to a stress value to determine the third stress. In an embodiment, the comparing may include determining a difference between the measured warpage and the baseline warpage.

FIG. 5 illustrates a method 500 for annealing a substrate according to another embodiment. The method may include determining a first stress for the substrate based on a reflectivity of the substrate (block 501); determining a second stress for the substrate based on cracks in the substrate (block 502); determining a third stress for the substrate based on a warpage of the substrate (block 503); determining a fourth stress based, at least in part, on the first stress (block 504), the second stress and the third stress; and annealing the substrate based on a comparison between the fourth stress and an expected stress for the substrate (block 505). For example, the method 400 may reduce at least one of a peak anneal temperature and a maximum anneal duration for the annealing if the fourth stress is greater than or equal to the expected stress for the substrate.

In an embodiment, the determining the first stress may further include determining a baseline reflectivity of the substrate, measuring the reflectivity of the substrate, comparing the measured reflectivity to the baseline reflectivity and correlating the comparison to a stress value to determine the first stress. The comparing may include determining a difference between the measured reflectivity and the baseline reflectivity.

In another embodiment, the determining the second stress may include determining a number of cracks in the substrate. The second stress may be determined, at least in part, based on the number of cracks in the substrate. In another embodiment, the determining the second stress may include determining a maximum crack radius for one or more cracks in the substrate. The second stress may be based, at least in part, on the maximum crack radius of the one or more cracks in the substrate. In another embodiment, the determining the second stress may include determining a number of cracks in a first and/or second lateral surface of the substrate. The second stress may be determined, at least in part on the number of cracks in the first and/or second lateral surface. In another embodiment, the determining the second stress may include determining a number of cracks in one or more vertical surfaces (sides) of the substrate. The second stress may be determined, at least in part, based on the number of cracks in the one or more vertical surfaces. In another embodiment, the determining the second stress may include determining a number of cracks buried in the substrate. The second stress may be determined, at least in part, based on the number of cracks buried in the substrate. In another embodiment, the determining the second stress may include determining a proximity of a crack to an edge of the substrate. The second stress may be determined, at least in part, based on the proximity of the crack to the edge of the substrate.

In another embodiment, the determining the third stress may further include determining a baseline warpage of the substrate, measuring the warpage of the substrate, comparing the measured warpage to the baseline warpage and correlating the comparison to a stress value to determine the third stress. In an embodiment, the comparing may include determining a difference between the measured warpage and the baseline warpage.

In an embodiment, a system is provided. The system may include a plurality of measuring units, wherein each of the measuring units measures one or more characteristics for a substrate and outputs a corresponding status signal for each of the one or more measured characteristics; and a control unit, wherein the control unit outputs an anneal control signal based on at least one of the status signals from the plurality of measuring units, the anneal control signal including at least one of a peak anneal temperature and a peak anneal duration. The system may further include an anneal unit, wherein the anneal unit receives the anneal control and performs a millisecond anneal based on the anneal control signal. In an embodiment, the anneal unit may be within a common processing chamber with the plurality of measuring units. In another embodiment, the anneal unit may be within a common processing chamber with at least one of the plurality of measuring units.

In an embodiment, a method is provided. The method may include determining a plurality of stresses on a substrate; determining an overall stress value on the substrate based, at least in part, on the plurality of stresses; and controlling an anneal for the substrate based on a comparison between the overall stress value on the substrate and a strength threshold for the substrate.

In another embodiment, another method is provided. The method may include determining a first stress for a substrate based on a reflectivity of the substrate; determining a second stress for the substrate based on cracks in the substrate; determining a third stress for the substrate based on a warpage of the substrate; determining a fourth stress based, at least in part, on the first stress, the second stress and the third stress; and annealing the substrate based, at least in part, on a comparison between the fourth stress and a threshold strength for the substrate.

Although the present embodiments and their advantages have been described in detail, it should be understood that various changes, substitutions and alterations can be made herein without departing from the spirit and scope of the disclosure as defined by the appended claims. For example, it will be readily understood by those skilled in the art that the structures and ordering of steps as described above may be varied while remaining within the scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A system comprising:
a plurality of measuring units, the measuring units measuring a plurality of characteristics indicative of stress of a substrate, wherein each measuring unit measures a characteristic different from a characteristic measured by the other measuring units of the plurality of measuring units, and each measuring unit outputs a corresponding status signal for the characteristic measured, wherein the plurality of measuring units respectively comprise a reflectivity measuring unit, a crack measuring unit, and a warpage measuring unit, and wherein at least one of the plurality of characteristics is a number of cracks in the substrate, wherein said crack measuring unit measures at least one of the number of cracks in a major surface of the substrate or the number of cracks buried within the substrate, and comprises an X-ray diffraction unit or a digital image processing unit and provides an indication of the measured number of cracks;
a control unit, wherein the control unit outputs an anneal control signal based on at least one of the status signals from the plurality of measuring units, the anneal control signal including a value selected from the group consisting essentially of a peak anneal temperature, a peak anneal duration, and combinations of same; and
an anneal unit, wherein the anneal unit receives the anneal control signal and performs a millisecond anneal (MSA) based on the anneal control signal;
wherein the plurality of measuring units are in a first chamber and the anneal unit is in a second chamber.

2. The system of claim 1, wherein at least one of the plurality of characteristics is warpage of the substrate, wherein at least one of the plurality of measuring units measures the warpage of the substrate, compares the measured warpage to a maximum warpage threshold for the substrate, and provides an indication if the measured warpage is greater than the maximum warpage threshold for the substrate.

3. The system of claim 1, wherein at least one of the plurality of characteristics is warpage of the substrate, wherein at least one of the plurality of measuring units measures the warpage of the substrate and provides an indication of the measured warpage for the substrate.

4. The system of claim 1, wherein at least one of the plurality of characteristics is reflectivity of the substrate, wherein at least one of the plurality of measuring units measures the reflectivity of the substrate, determines a difference between the measured reflectivity and a baseline reflectivity for the substrate, and provides an indication of the difference.

5. The system of claim 1, wherein the crack measuring unit measures the number of cracks buried within the substrate.

6. A system comprising:
a plurality of measuring units, the measuring units measuring a plurality of characteristics indicative of stress of a substrate, wherein each measuring unit measures a characteristic different from a characteristic measured by the other measuring units of the plurality of measuring units, and each measuring unit outputs a corresponding status signal for the characteristic measured, wherein the plurality of measuring units respectively comprise a reflectivity measuring unit, a crack measuring unit, and a warpage measuring unit, and wherein at least one of the plurality of characteristics is a number of cracks in the substrate, wherein said crack measuring unit measures at least one of the number of cracks in a major surface of the substrate or the number of cracks buried within the substrate, and comprises an X-ray diffraction unit or a digital image processing unit and provides an indication of the measured number of cracks, wherein at least one of the plurality of characteristics is a radius for one or more cracks in the substrate, wherein at least one of the plurality of measuring units measures the radius for the one or more cracks in the substrate, compares each measured crack radius to a maximum crack radius threshold for the substrate, and provides an indication if a measured crack radius exceeds the maximum crack radius threshold for the substrate; and a control unit, wherein the control unit outputs an anneal control signal based on at least one of the status signals from the plurality of measuring units, the anneal control signal including a value selected from the group consisting essentially of a peak anneal temperature, a peak anneal duration, and combinations of same.

7. A system comprising:

a plurality of measuring units, the measuring units measuring a plurality of characteristics indicative of stress of a substrate, wherein each measuring unit measures a characteristic different from a characteristic measured by the other measuring units of the plurality of measuring units, and each measuring unit outputs a corresponding status signal for the characteristic measured, wherein the plurality of measuring units respectively comprise a reflectivity measuring unit, a crack measuring unit, and a warpage measuring unit, and wherein at least one of the plurality of characteristics is a number of cracks in the substrate, wherein said crack measuring unit measures at least one of the number of cracks in a major surface of the substrate or the number of cracks buried within the substrate, and comprises an X-ray diffraction unit or a digital image processing unit and provides an indication of the measured number of cracks, wherein at least one of the plurality of characteristics is a radius for one or more cracks in the substrate, wherein at least one of the plurality of measuring units measures the radius for the one or more cracks in the substrate, determines a maximum crack radius for the substrate, and provides an indication of the maximum crack radius for the substrate; and a control unit, wherein the control unit outputs an anneal control signal based on at least one of the status signals from the plurality of measuring units, the anneal control signal including a value selected from the group consisting essentially of a peak anneal temperature, a peak anneal duration, and combinations of same.

8. A system comprising:

a first measuring unit configured to measure a first characteristic indicative of stress of a substrate and to output a first status signal indicative of the first characteristic;

a second measuring unit configured to measure a second characteristic indicative of stress of a substrate, different from the first characteristic, and to output a second status signal indicative of the second characteristic;

a third measuring unit configured to measure a third characteristic indicative of stress of a substrate, different from the first characteristic and the second characteristic, and to output a third status signal indicative of the third characteristic;

a control unit, configured to receive the first, second and third status signals and generate an anneal control signal based on one or more of the first, second and third status signals; and an anneal unit coupled to the control unit, the anneal unit configured to receive the anneal control signal, and wherein the first measuring unit is a reflectivity measuring unit, the second measuring unit is a crack measuring unit, and the third measuring unit is a warpage measuring unit and wherein the first, second and third measuring units are in a first chamber and the anneal unit is in a second chamber.

9. The system of claim 8, wherein the anneal control signal includes a value selected from the group consisting of a peak anneal temperature, a peak anneal duration, and combinations of same.

10. The system of claim 8, wherein the second measuring unit measures the number of cracks buried within the substrate.

* * * * *